United States Patent
Klubek et al.

(10) Patent No.: US 6,919,140 B2
(45) Date of Patent: *Jul. 19, 2005

(54) ORGANIC ELECTROLUMINESCENT DEVICES WITH HIGH LUMINANCE

(75) Inventors: Kevin P. Klubek, Webster, NY (US); J. Ramon Vargas, Webster, NY (US); Liang-Sheng Liao, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/617,319

(22) Filed: Jul. 10, 2003

(65) Prior Publication Data

US 2005/0014018 A1 Jan. 20, 2005

(51) Int. Cl.$^7$ ............................................. H05B 33/14
(52) U.S. Cl. ........................ 428/690; 428/917; 313/504
(58) Field of Search .................... 428/690, 917; 313/504, 506

(56) References Cited

U.S. PATENT DOCUMENTS

| | | | |
|---|---|---|---|
| 3,172,862 A | 3/1965 | Gurnee et al. | |
| 3,173,050 A | 3/1965 | Gurnee | |
| 3,710,167 A | 1/1973 | Dresner et al. | |
| 4,356,429 A | 10/1982 | Tang | |
| 4,539,507 A | 9/1985 | VanSlyke et al. | |
| 4,720,432 A | 1/1988 | VanSlyke et al. | |
| 4,769,292 A | 9/1988 | Tang et al. | |
| 5,061,569 A | 10/1991 | VanSlyke et al. | |
| 5,409,783 A | 4/1995 | Tang et al. | |
| 5,554,450 A | 9/1996 | Shi et al. | |
| 5,593,788 A | 1/1997 | Shi et al. | |
| 5,683,823 A | 11/1997 | Shi et al. | |
| 5,908,581 A | 6/1999 | Chen et al. | |
| 5,928,802 A | 7/1999 | Shi et al. | |
| 6,020,078 A | 2/2000 | Chen et al. | |
| 6,208,077 B1 | 3/2001 | Hung | |
| 2004/0004215 A1 * | 1/2004 | Iechi et al. | .................. 257/40 |

FOREIGN PATENT DOCUMENTS

| | | | |
|---|---|---|---|
| EP | 0 891 121 | | 1/1999 |
| JP | 61-043689 A | * | 3/1986 |
| JP | 10-251633 A | * | 9/1998 |
| JP | 11-273830 | | 10/1999 |
| JP | 2000021574 | * | 1/2000 |
| JP | 2000260565 | * | 9/2000 |

OTHER PUBLICATIONS

Wang et al., Chemical Materials, vol. 15, pp. 1913–1917, (2003).*

"Double Injection Electroluminescence in Anthracene" by J. Dresner, RCA Review, vol. 30, 1969, pp. 322–335.

* cited by examiner

*Primary Examiner*—Dawn Garrett
(74) *Attorney, Agent, or Firm*—Raymond L. Owens

(57) ABSTRACT

A multilayer electroluminescent device comprising a cathode, an anode, a light emitting layer, and a layer disposed between the cathode and anode containing a dihydrophenazine compound is disclosed.

40 Claims, 1 Drawing Sheet

ORGANIC ELECTROLUMINESCENT DEVICES WITH HIGH LUMINANCE

FIELD OF THE INVENTION

This invention relates to organic electroluminescent devices having hole transport layers.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are U.S. Pat. Nos. 3,172,862 and 3,173,050; J. Dresner, "Double Injection Electroluminescence in Anthracene", RCA Review, Vol. 30, pp. 322–334, 1969; and U.S. Pat. No. 3,710,167. The organic layers in these devices, usually composed of a polycyclic aromatic hydrocarbon, were very thick (much greater than 1 $\mu$m). Consequently, operating voltages were very high, often >100V.

Herein, the term "EL element" encompasses the layers between the anode and cathode. Recent organic EL devices include an organic EL element consisting of extremely thin layers (e.g. <1.0 $\mu$m) between the anode and the cathode. Reducing the thickness lowers the resistance of the organic layer and has enabled devices that operate using much lower voltage. In a basic two-layer EL device structure, described first in U.S. Pat. No. 4,356,429, one organic layer of the EL element adjacent to the anode is specifically chosen to transport holes; therefore, it is referred to as the hole-transporting layer (HTL). The other organic layer is specifically chosen to transport electrons, and is referred to as the electron-transporting layer (ETL). The interface between the two layers provides an efficient site for the recombination of the injected hole/electron pairs which results in light emission.

Additional layers have been proposed to further improve device performance, e.g., as described in U.S. Pat. No. 4,769,292. This patent discloses an organic light-emitting layer (LEL) between the HTL and ETL, and the concept of a hole-injecting layer (HIL) located between the anode and the HTL.

Materials comprising porphyrinic compounds have been disclosed by Tang in U.S. Pat. No. 4,356,429 for use in the HTL. Further improvements in device performance are taught in U.S. Pat. Nos. 4,539,507; 4,720,432; and 5,061,569 where the hole-transporting layer utilizes an aromatic tertiary amine.

Since these early inventions, further improvements in hole-transporting and other device materials have resulted in improved device performance in attributes such as color, stability, luminance efficiency and manufacturability, e.g., as disclosed in U.S. Pat. Nos. 5,061,569; 5,409,783; 5,554,450; 5,593,788; 5,683,823; 5,908,581; 5,928,802; 6,020,078; and 6,208,077, amongst others. EP 891,121 and EP 1,029,909 suggest the use of biphenylene and phenylene diamine derivatives to improve hole injecting and/or transporting and JP 11-273830 suggests the use of naphthyldiamine derivatives in EL elements generally.

Notwithstanding these developments, there are continuing needs for organic EL device components that will provide a desired high luminance.

SUMMARY OF THE INVENTION

It is an object of the present invention to provide an improved material for use in a hole-injecting layer of an organic electroluminescent device.

This object is achieved by providing a multilayer electroluminescent device comprising a cathode, an anode, a light emitting layer (LEL) and a layer disposed between the cathode and anode containing a dihydrophenazine compound represented by Formula (1):

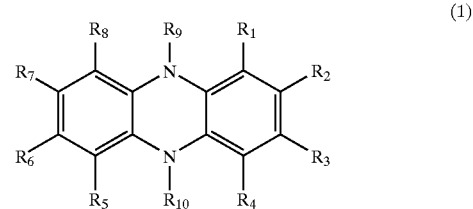

(1)

wherein:

$R_1$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino, or connected to $R_2$ to form 5 or 6 member rings which may be substituted or unsubstituted;

$R_4$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino, or connected to $R_3$ to form 5 or 6 member rings which may be substituted or unsubstituted;

$R_5$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl, substituted alkenyl, alkoxy, aryloxy, amino, or connected to $R_6$ to form 5 or 6 member rings which may be substituted or unsubstituted;

$R_8$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino, or connected to $R_7$ to form 5 or 6 member rings which may be substituted or unsubstituted;

$R_2$ and $R_3$ are individually hydrogen, alkyl of from 1 to 24 carbon atoms, which are branched, unbranched, or cyclic, halogen, aryl or substituted aryl of from 5 to 24 carbon atoms, heterocyclic or substituted heterocyclic, alkenyl or substituted alkenyl, alkoxy, aryloxy, amino, thioaryl, thioalkyl, or connected to form 5 or 6 member rings which may be substituted or unsubstituted;

$R_6$ and $R_7$ are individually hydrogen, alkyl of from 1 to 24 carbon atoms, which are branched, unbranched, or cyclic, halogen, aryl or substituted aryl of from 5 to 24 carbon atoms, heterocyclic or substituted heterocyclic, alkenyl or substituted alkenyl, alkoxy, aryloxy, amino, thioaryl, thioalkyl, or connected to form 5 or 6 member rings which may be substituted or unsubstituted; and $R_9$ and $R_{10}$ are individually hydrogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl.

Advantages

An advantage of the present invention is that the use of a dihydrophenazine compound in the hole injection layer enables an organic electroluminescent device with improved luminance efficiencies.

DETAILED DESCRIPTION OF THE INVENTION

Figure 1:
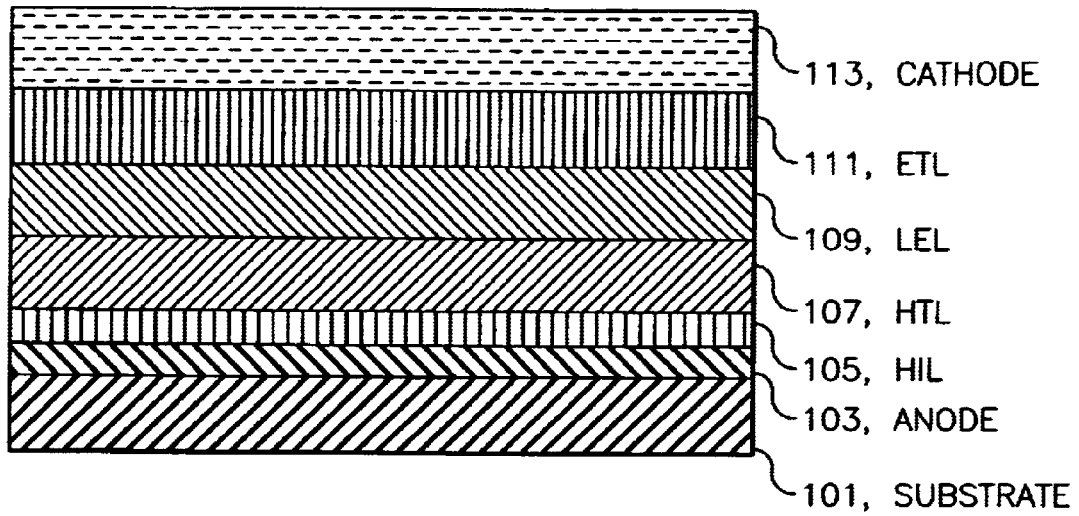
FIG. 1 is a schematic diagram showing a cross-section of a first organic EL device of the invention.

The EL device of the invention is generally as described above. In one preferred embodiment, the EL device contains at least one dihydrophenazine compound described by Formula (1):

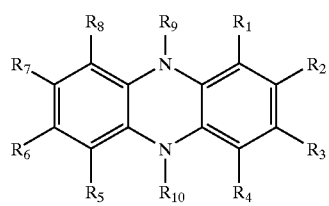

wherein:

$R_1$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino, or connected to $R_2$ to form 5 or 6 member rings which may be substituted or unsubstituted;

$R_4$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino, or connected to $R_3$ to form 5 or 6 member rings which may be substituted or unsubstituted;

$R_5$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl, substituted alkenyl, alkoxy, aryloxy, amino, or connected to $R_6$ to form 5 or 6 member rings which may be substituted or unsubstituted;

$R_8$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino, or connected to $R_7$ to form 5 or 6 member rings which may be substituted or unsubstituted;

$R_2$ and $R_3$ are individually hydrogen, alkyl of from 1 to 24 carbon atoms, which are branched, unbranched, or cyclic, halogen, aryl or substituted aryl of from 5 to 24 carbon atoms, heterocyclic or substituted heterocyclic, alkenyl or substituted alkenyl, alkoxy, aryloxy, amino, thioaryl, thioalkyl, or connected to form 5 or 6 member rings which may be substituted or unsubstituted;

$R_6$ and $R_7$ are individually hydrogen, alkyl of from 1 to 24 carbon atoms, which are branched, unbranched, or cyclic, halogen, aryl or substituted aryl of from 5 to 24 carbon atoms, heterocyclic or substituted heterocyclic, alkenyl or substituted alkenyl, alkoxy, aryloxy, amino, thioaryl, thioalkyl, or connected to form 5 or 6 member rings which may be substituted or unsubstituted; and $R_9$ and $R_{10}$ are individually hydrogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl.

The device is not limited as to the other materials used in the EL device. The LEL of the device typically contains a metal complex of a quinoline derivative, such as tris(8-quinolinolato)aluminum (III) (AlQ$_3$). Alternatively, it may contain a compound having the formula:

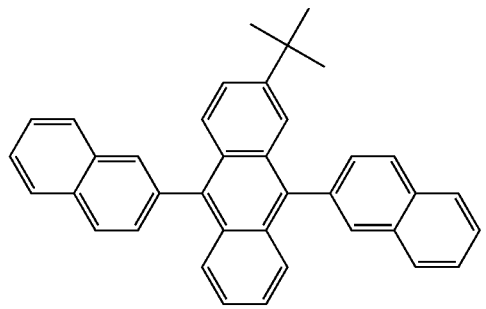

Dopants are also commonly employed in the LEL layers.

The dihydrophenazine compound is usually contained in a layer between the anode and the LEL. That layer may or may not be adjacent to the anode. In some embodiments of the invention, it is desirable that the compound is not adjacent to the LEL. The naphthalene compound useful in the invention is effective to improve the luminance efficiency of the EL device. It is believed that there is a further improvement when there is present in a layer between the anode and LEL a second compound that functions to improve hole transporting.

A suitable second compound is represented by Formula C:

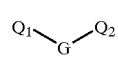

wherein $Q_1$ and $Q_2$ are independently selected aromatic tertiary amine moieties and G is a linking group or a bond. An example of the second compound is N,N'-di(1-naphthyl)-N,N'-diphenyl-4,4'-diaminobiphenyl. Suitably, the compound of Formula C is contained in the layer adjacent to the LEL.

The EL device of the invention is desirably used as a component in a static or motion imaging device, such as a television, cell phone, DVD player, or computer monitor.

Illustrative examples of dihydrophenazine compounds useful in the present invention are shown in Table 1:

TABLE 1

| P-Type Host Materials: | Compound: |
|---|---|
| | (V) |
| | (VI) |
| | (VII) |
| | (VIII) |
| | (IX) |

TABLE 1-continued

| P-Type Host Materials: | Compound: |
|---|---|
| | (X) |
| | (XI) |
| | (XII) |
| | (XIII) |

TABLE 1-continued

| P-Type Host Materials: | Compound: |
|---|---|
| | (XIV) |
| | (XV) |
| | (XVI) |
| | (XVII) |

TABLE 1-continued

| P-Type Host Materials: | Compound: |
|---|---|
| | (XVIII) |
| | (XIX) |
| | (XX) |
| | (XXI) |

TABLE 1-continued

| P-Type Host Materials: | Compound: |
|---|---|
| | (XXII) |
| | (XXIII) |
| | (XXIV) |
| | (XXV) |

TABLE 1-continued

| P-Type Host Materials: | Compound: |
|---|---|
| | (XXVI) |
| | (XXVII) |
| | (XXVIII) |
| | (XXIX) |

TABLE 1-continued

| P-Type Host Materials: | Compound: |
|---|---|
| | (XXX) |
| | (XXXI) |
| | (XXXII) |

TABLE 1-continued
| P-Type Host Materials: | Compound: |
|---|---|
| 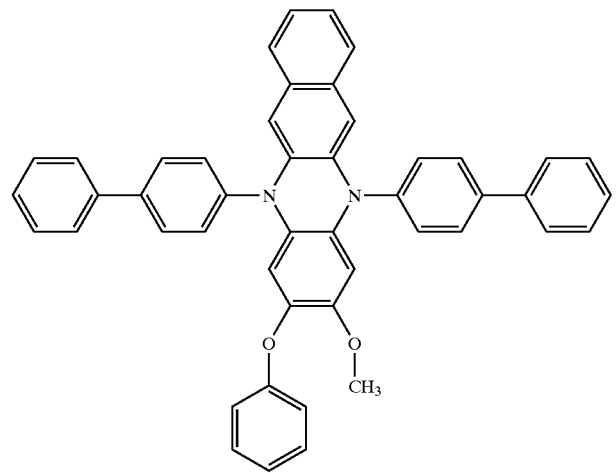 | (XXXIII) |
| 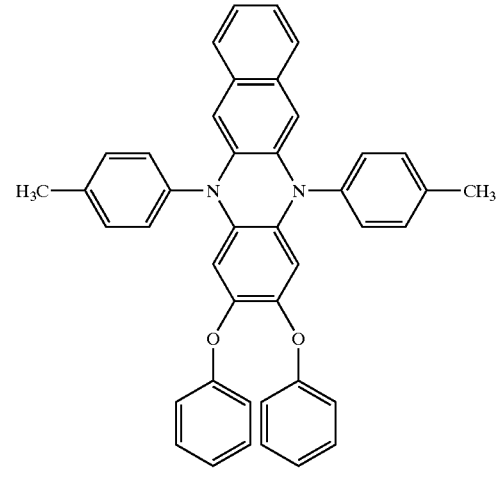 | (XXXIV) |
| 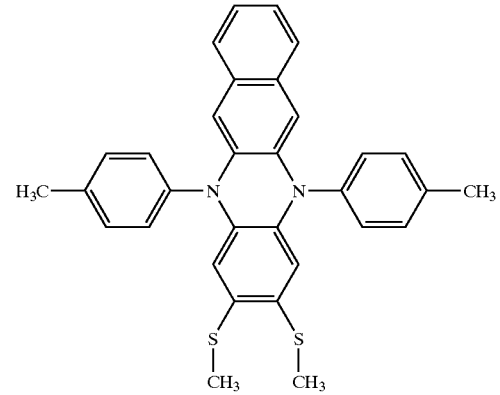 | (XXXV) |

TABLE 1-continued

| P-Type Host Materials: | Compound: |
|---|---|
| | (XXXVI) |
| | (XXXVII) |
| | (XXXVIII) |

TABLE 1-continued
| P-Type Host Materials: | Compound: |
|---|---|
| 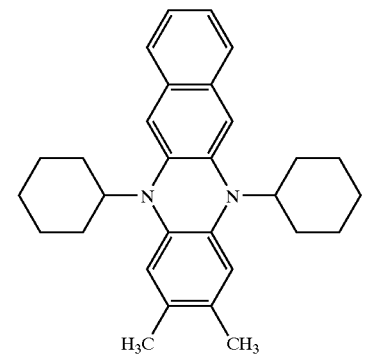 | (XXXIX) |
| 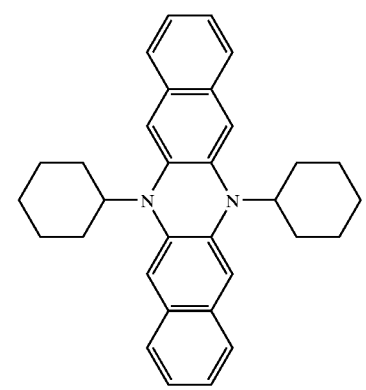 | (XL) |
| 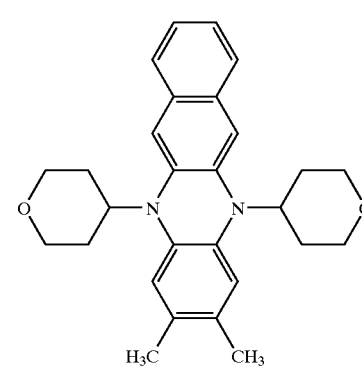 | (XLI) |
| 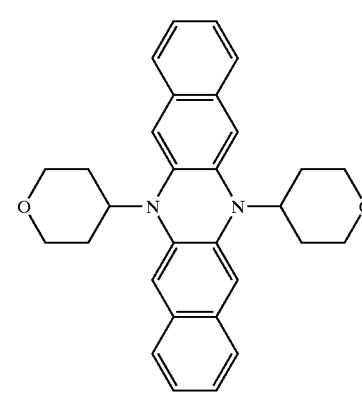 | (XLII) |

TABLE 1-continued

| P-Type Host Materials: | Compound: |
|---|---|
| | (XLIII) |
| | (XLIV) |
| | (XLV) |
| | (XLVI) |

TABLE 1-continued

| P-Type Host Materials: | Compound: |
|---|---|
| | (XLVII) |
| | (XLVIII) |
| | (XLIX) |

TABLE 1-continued

| P-Type Host Materials: | Compound: |
|---|---|
| | (L) |
| | (LI) |
| | (LII) |

TABLE 1-continued

| P-Type Host Materials: | Compound: |
|---|---|
| | (LIII) |
| | (LIV) |
| | (LV) |
| | (LVI) |

TABLE 1-continued

| P-Type Host Materials: | Compound: |
|---|---|
| | (LVII) |
| | (LVIII) |
| | (LIX) |
| | (LX) |

TABLE 1-continued

| P-Type Host Materials: | Compound: |
|---|---|
| | (LXI) |
| | (LXII) |
| | (LXIII) |
| | (LXIV) |

TABLE 1-continued
| P-Type Host Materials: | Compound: |
|---|---|
| 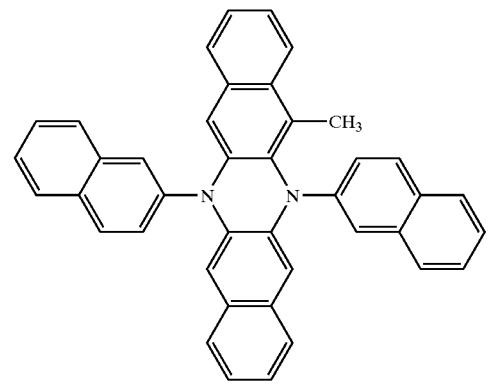 | (LXV) |
| 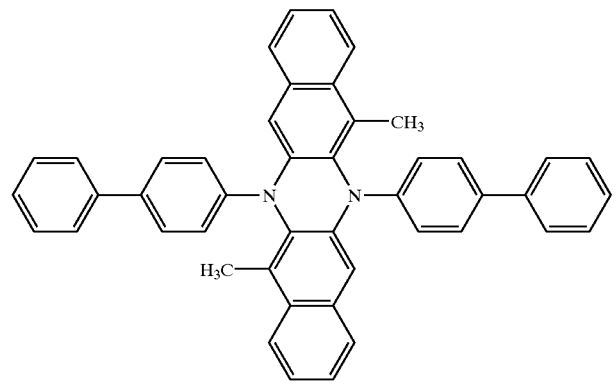 | (LXVI) |
| 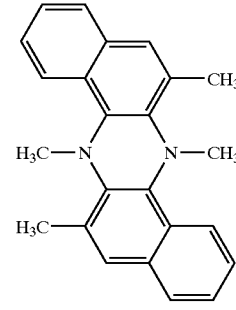 | (LXVII) |
| 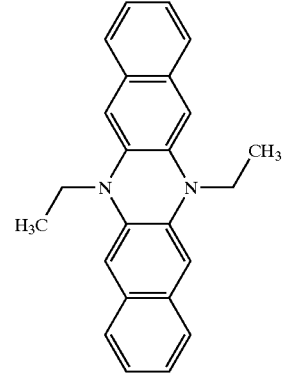 | (LXVIII) |

TABLE 1-continued

| P-Type Host Materials: | Compound: |
|---|---|
| | (LXIX) |
| | (LXX) |
| | (LXXI) |
| | (LXXII) |

TABLE 1-continued

| P-Type Host Materials: | Compound: |
|---|---|
| | (LXXIII) |
| | (LXXIV) |
| | (LXXV) |
| | (LXXVI) |

TABLE 1-continued

| P-Type Host Materials: | Compound: |
|---|---|
| | (LXXVII) |
| | (LXXVIII) |
| | (LXXIX) |
| | (LXXX) |

TABLE 1-continued

| P-Type Host Materials: | Compound: |
|---|---|
| | (LXXXI) |
| | (LXXXII) |
| | (LXXXIII) |
| | (LXXXIV) |

TABLE 1-continued

| P-Type Host Materials: | Compound: |
|---|---|
| | (LXXXV) |
| | (LXXXVI) |
| | (LXXXVII) |

TABLE 1-continued

| P-Type Host Materials: | Compound: |
|---|---|
| | (LXXXVIII) |
| | (LXXXIX) |
| | (XC) |
| | (XCI) |

TABLE 1-continued

| P-Type Host Materials: | Compound: |
|---|---|
| (structure) | (XCII) |

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT). The total combined thickness of the organic layers is preferably less than 500 nm.

Figure 2:
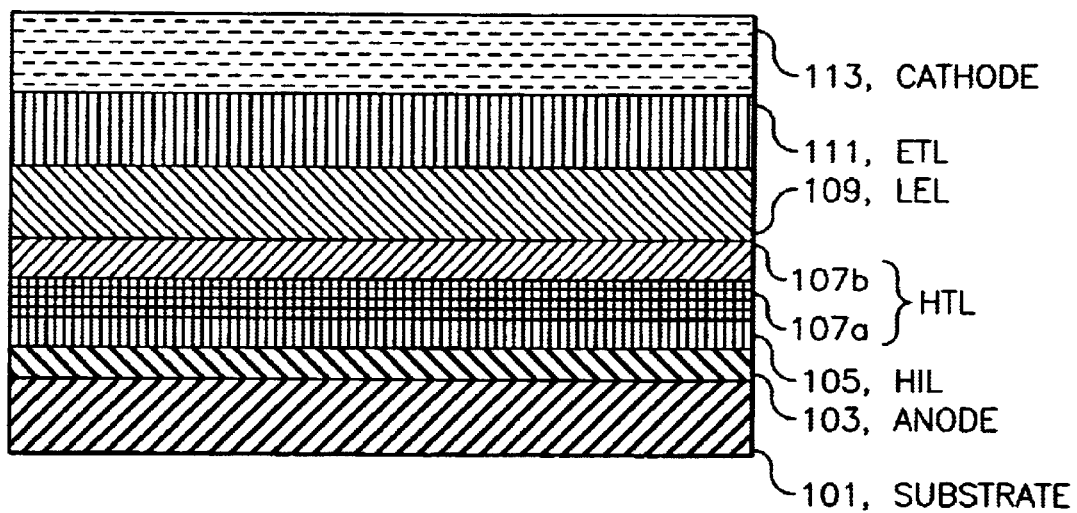
FIG. 2 is a schematic diagram showing across-section of a second organic EL device of the invention.

There are numerous configurations of the organic layers wherein the present invention can be successfully practiced. The compound of Formula 1 can be used wherever a hole transport material is called for. A typical structure is shown in FIG. 1 and is comprised of a substrate 101, an anode layer 103, an optional hole-injecting layer (HIL) 105, a hole-transporting layer (HTL) 107, a light-emitting layer (LEL) 109, an electron-transporting layer (ETL) 111, and a cathode layer 113. These layers are described in detail below. FIG. 2 shows a variation of this embodiment in which there are employed two hole-transporting sublayers, 107a and 107b.

Substrate

The substrate 101 can either be light transmissive or opaque, depending on the intended direction of light emission. The light transmissive property is desirable for viewing the EL emission through the substrate. The transparent substrate may contain, or have built up on it, various electronic structures or circuitry (e.g., low temperature polysilicon TFT structures) so long as a transparent region or regions remain. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course, it is necessary to provide in these device configurations a light transparent top electrode. The substrate, in some cases, may actually constitute the anode or cathode.

Anode

The conductive anode layer 103 is formed over the substrate and, when EL emission is viewed through the anode, should be transparent or substantially transparent to the emission of interest. Common transparent anode materials used in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. For applications where EL emission is viewed through the top electrode, the transmissive characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-injecting Layer (HIL)

While not always necessary, it is often useful that a hole-injecting layer 105 be provided adjacent to the anode 103 and between the anode and the hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers (CFx) as described in U.S. Pat. No. 6,208,075, and some aromatic amines, for example, m-MTDATA (4,4', 4"-tris[(3-methylphenyl)phenylamino]triphenylamine). Alternative hole-injecting materials reportedly useful in organic EL devices are described in EP 0 891 121 A1 and EP 1,029,909 A1. It is possible to employ materials useful in the invention in addition to the foregoing materials.

Hole-transporting Layer (HTL)

In a desirable embodiment of this invention, the hole-transporting layer 107 (or layers 107a and 107b) of the organic EL device contains at least one compound described in Formula 1. While the dihydrophenzine compound of Formula 1 can be used alone as the HTL material, a useful embodiment is to use two HTL materials preferably where the layer 107 is divided into two regions or sublayers, 107a and 107b, as shown in FIG. 2. The dihydrophenazine compound of Formula (1) can be used in either or both layers, but it is preferred if it is at least used in layer 107a, closer to the anode.

Other HTL materials described below can be used in combination with Formula (1) as a mixture in layer 107, or as a discrete material or mixture in layers 107a or 107b. One useful class of hole-transporting compounds are aromatic tertiary amines, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. No. 3,567,450 and U.S. Pat. No. 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula C.

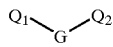

C wherein:

Q$_1$ and Q$_2$ are independently selected aromatic tertiary amine moieties; and G is a linking group such as an arylene, cycloalkylene, or alkylene group of a carbon to carbon bond.

In one embodiment, at least one of Q$_1$ or Q$_2$ contains a polycyclic fused ring structure, e.g., a naphthalene. When G is an aryl group, it is conveniently a phenylene, biphenylene, or naphthalene moiety.

A useful class of triarylamines satisfying structural Formula C and containing two triarylamine moieties is represented by structural Formula D:

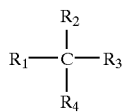

D wherein:

R$_1$ and R$_2$ each independently represents a hydrogen atom, an aryl group, or an alkyl group or R$_1$ and R$_2$ together represent the atoms completing a cycloalkyl group; and R$_3$ and R$_4$ each independently represents an aryl group, which is in turn substituted with a diaryl substituted amino group, as indicated by structural Formula E:

E wherein

R$_5$ and R$_6$ are independently selected aryl groups. In one embodiment, at least one of R$_5$ or R$_6$ contains a polycyclic fused ring structure, e.g., a naphthalene.

Another class of aromatic tertiary amines are the tetraaryldiamines. Desirable tetraaryldiamines include two diarylamino groups, such as indicated by Formula E, linked through an arylene group. Useful tetraaryldiamines include those represented by Formula F:

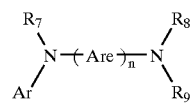

F wherein:

each Are is an independently selected arylene group, such as a phenylene or anthracene moiety;

n is an integer of from 1 to 4; and

Ar, R$_7$, R$_8$, and R$_9$ are independently selected aryl groups. In a typical embodiment, at least one of Ar, R$_7$, R$_8$, and R$_9$ is a polycyclic fused ring structure, e.g., a naphthalene The various alkyl, alkylene, aryl, and arylene moieties of the foregoing structural Formulae C, D, E, F, can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

Illustrative of useful aromatic tertiary amines are the following:

1,1-Bis(4-di-p-tolylaminophenyl)cyclohexane 1,1-Bis(4-di-p-tolylaminophenyl)-4-phenylcyclohexane 4,4'-Bis(diphenylamino)quadriphenyl Bis(4-dimethylamino-2-methylphenyl)-phenylmethane N,N,N-Tri(p-tolyl)amine 4-(di-p-tolylamino)-4'-[4(di-p-tolylamino)-styryl]stilbene N,N,N',N'-Tetra-p-tolyl-4-4'-diaminobiphenyl N,N,N',N'-Tetraphenyl-4,4'-diaminobiphenyl N-Phenylcarbazole Poly(N-vinylcarbazole), and N,N'-di-1-naphthalenyl-N,N'-diphenyl-4,4'-diaminobiphenyl.

4,4'-Bis[N-(1-naphthyl)-N-phenylamino]biphenyl 4,4''-Bis[N-(1-naphthyl)-N-phenylamino]p-terphenyl 4,4'-Bis[N-(2-naphthyl)-N-phenylamino]biphenyl "NPB"

4,4'-Bis[N-(3-acenaphthenyl)-N-phenylamino]biphenyl 1,5-Bis[N-(1-naphthyl)-N-phenylamino]naphthalene 4,4'-Bis[N-(9-anthryl)-N-phenylamino]biphenyl 4,4''-Bis[N-(1-anthryl)-N-phenylamino]-p-terphenyl 4,4'-Bis[N-(2-phenanthryl)-N-phenylamino]biphenyl 4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
N,N'-di-1-naphthalenyl-N,N'-di-2-naphthalenyl-[1,1'-biphenyl]-4,4'-diamine.

Light-emitting Layer (LEL)

As more fully described in U.S. Pat. Nos. 4,769,292 and 5,935,721, the light-emitting layer 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, a mixture of hole- and electron-transporting materials, or another material or mixture that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula G) constitute one class of useful host compounds capable of supporting electroluminescence, and are particularly suitable for light emission of wavelengths longer than 500 nm, e.g., green, yellow, orange, and red.

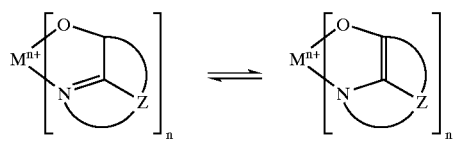

G wherein:

M represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo{f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithum oxine [alias, (8-quinolinolato)lithium(I)]

Derivatives of 9,10-di-(2-naphthyl)anthracene (Formula H) constitute one class of useful hosts capable of supporting electroluminescence, and are particularly suitable for light emission of wavelengths longer than 400 nm, e.g., blue, green, yellow, orange or red.

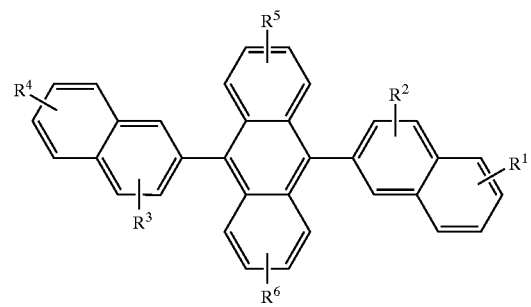

H wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula I) constitute another class of useful hosts capable of supporting electroluminescence, and are particularly suitable for light emission of wavelengths longer than 400 nm, e.g., blue, green, yellow, orange or red.

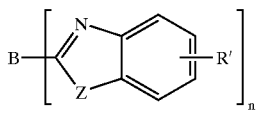

I where:

N is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;

B is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful luminescent dopants include, but are not limited to, the following:

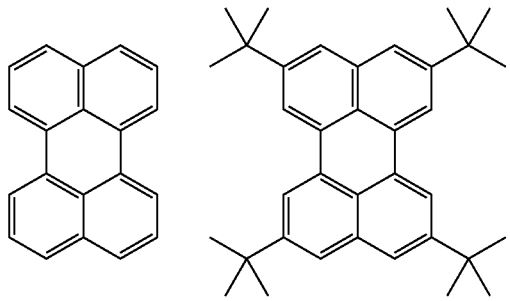

-continued

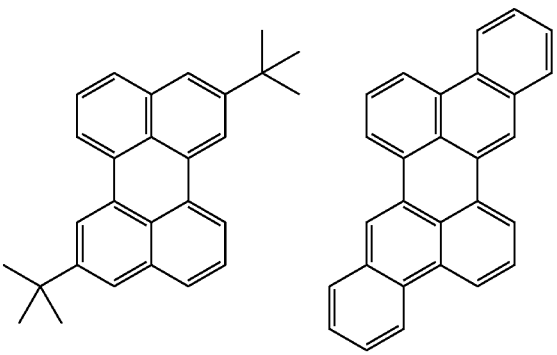

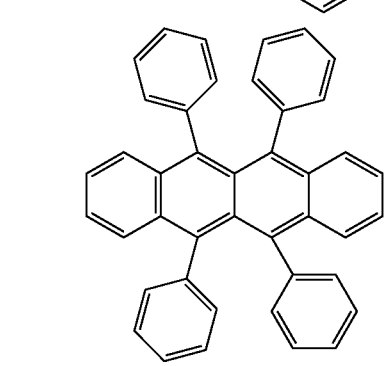

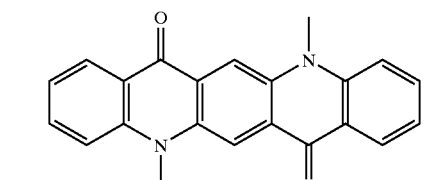

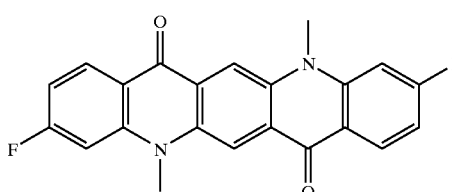

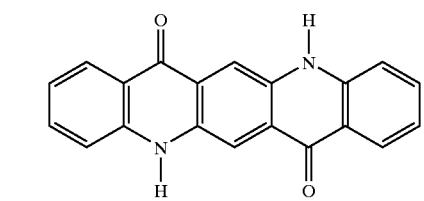

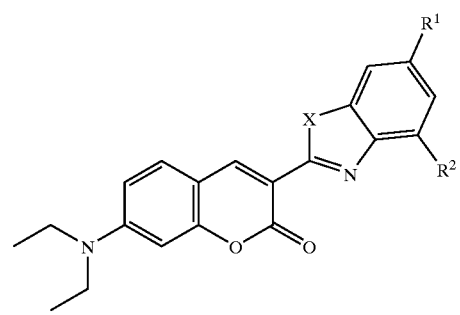

X = O or S,
R1 = H, methyl or t-butyl,
R2 = H, methyl or t-butyl

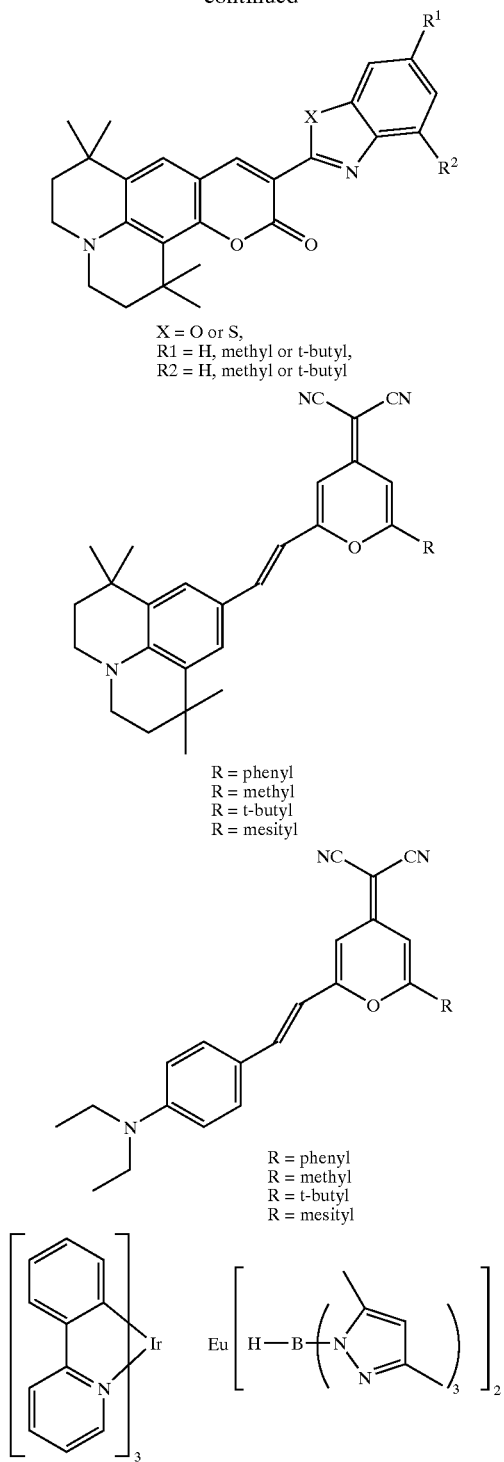

Electron-transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula G, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula I are also useful electron transporting materials.

In some instances, layers 109 and 111 can optionally be collapsed into a single layer that serves the function of supporting both light emission and electron transportation.

Cathode

When light emission is through the anode, the cathode layer 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through a vapor-phase method such as thermal evaporation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by thermal evaporation can be vaporized from an evaporation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate evaporation boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357).

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

The entire contents of the patents and other publications referred to in this specification are incorporated herein by reference.

Synthesis of Dihydrophenazine Compounds Dihydrophenazine compounds can be synthesized in two steps. Step one involves a condensation reaction between an aryl dihydroxy derivative and an aryl diamino derivative to produce a dihydrophenazine intermediate. These intermediates, which are prone to oxidation if proper precaution is not taken, are then N-alkylated or N-arylated using well known Pd catalyzed cross coupling chemistry.

The synthesis of compounds I–IV is illustrated in the synthetic scheme. Compounds I–IV are then reacted with the appropriate aryl bromide to yield compounds V–XVII.

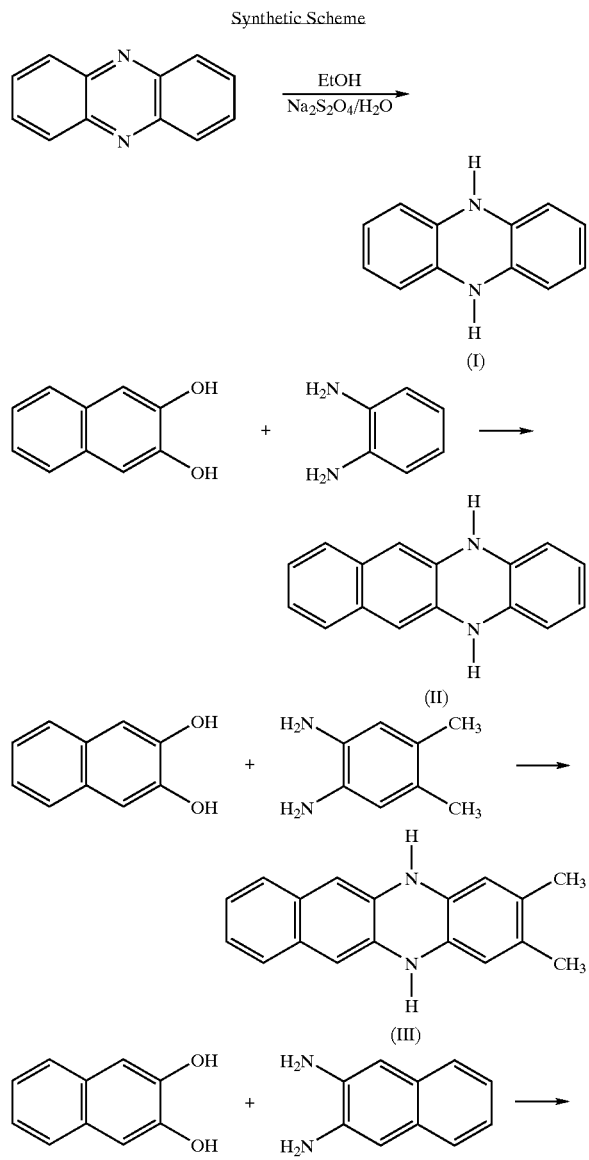
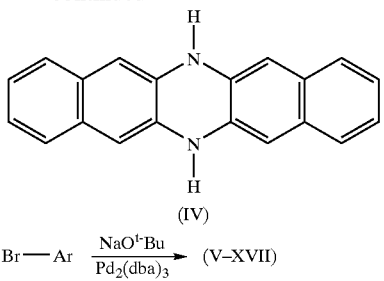

Synthesis of 5,10-dihydrophenazine (I)
Synthesized according to Mikulla, Markus; Mulhaupt, Rolf, *Macromol. Chem. Phys.*, 199, 795–805, (1998).

Synthesis of 5,12-dihydro-benzo[b]phenazine (II)
2,3-dihydroxynapthalene (10 g, 62.5 mmol), 1,2-phenylenediamine (6.75 g, 62.5 mmol) and N,N-dimethylaniline (54 ml) are placed into a round bottom flask under nitrogen atmosphere. Mixture is stirred at reflux. Reaction is monitored by TLC ($CH_2Cl_2$:Heptane/1:1) until all 2,3-dihydroxynaphthalene has reacted (~3 hours). After cooling to room temperature, toluene (100 ml) is added and solid is collected by vacuum filtration. After washing with toluene (50 ml), ethanol (100 ml) and hexanes (50 ml), the product is dried under vacuum to yield 11.0 g (76% yield) of light yellow solid.

Synthesis of 5,12-dihydro-2,3-dimethyl-benzo[b]phenazine (III)
2,3-dihydroxynapthalene (10 g, 62.5 mmol), 4,5-dimethyl-1,2-phenylenediamine (8.5 g, 62.5 mmol) and N,N-dimethylaniline (54 ml) are placed into a round bottom flask under nitrogen atmosphere. Mixture is stirred at reflux. Reaction is monitored by TLC ($CH_2Cl_2$:Heptane/1:1) until all 2,3-dihydroxynaphthalene has reacted (~3 hours). After cooling to room temperature, toluene (100 ml) is added and solid is collected by vacuum filtration. After washing with toluene (50 ml), ethanol (100 ml) and hexanes (50 ml), the product is dried under vacuum to yield 23.3 g (33% yield) of light yellow solid.

Synthesis of 6,13-dihydro-dibenzo[b,i]phenazine (IV)
2,3-dihydroxynapthalene (10 g, 62.5 mmol), 2,3-diaminonaphthalene (9.9 g, 62.5 mmol) and N,N-dimethylaniline (54 ml) are placed into a round bottom flask under nitrogen atmosphere. Mixture is stirred at reflux. Reaction is monitored by TLC ($CH_2Cl_2$:Heptane/1:1) until all 2,3-dihydroxynaphthalene has reacted (~3 hours). After cooling to room temperature, toluene (100 ml) is added and solid is collected by vacuum filtration. After washing with toluene (50 ml), ethanol (100 ml) and hexanes (50 ml), the product is dried under vacuum to yield 11.5 g (65% yield) of light yellow solid.

Procedure for the Pd Catalyzed Cross Coupling Reaction of Dihydrophenazines (I–IV) with Aryl Bromides Dihdyrophenazine compound, (1 equivalent), aryl bromide (2.2 equivalents), sodium tert-butoxide (3.0 equivalents), [$Pd_2(dba)_3$] tris(dibenzylideneacetone) dipalladium(0) (3 mol % of dihydrophenazine compound), tri-tert-butylphosphine (0.8 equivalents of Pd catalyst), and sodium tert-butoxide (3 equivalents) were all placed into a round bottom flask under a nitrogen atmosphere. Anhydrous toluene is added using a cannula and mixture is heated at reflux overnight. Two workup procedures were used depending on the solubility of the product in toluene.

Workup Procedure 1 (product not soluble in toluene): Upon cooling the reaction to room temperature, the precipitated solid is collected by vacuum filtration and washed with additional toluene. The filter cake is then washed extensively with water, followed by ethanol, cold tetrahydrofuran and lastly, hexanes. The product is then dried in an oven to give pure material.

Workup Procedure 2 (product is soluble in toluene): Reaction mixture is filtered while hot and the filter is washed with additional toluene. The filtrate is concentrated to a dark solid. After dissolving in $CH_2Cl_2$ and passing through a pad of silica gel, solvent is removed by rotary evaporation. Hexane is added and product is collected by filtration and dried in an oven to give pure material.

After products are collected by filtration and dried thoroughly, all materials are sublimed by train sublimation at 600 mTorr.

SYNTHESIS EXAMPLES

The invention and its advantages are further illustrated by the specific examples which follow.

Synthesis Example 1 (Compound VI)

5,12-di(p-tolyl)-5,12-dihydro-benzo(b)phenazine

The above general procedure was followed using compound (II) [3.0 g, 12.9 mmol], 4-bromotoluene [4.86 g, 28.5 mmol], sodium tert-butoxide [3.2 g, 33.3 mmol], $Pd_2(dba)_3$ [300 mg, 0.32 mmol], few drops tri-tert-butylphosphine and 50 ml toluene. Workup procedure 2 was used which gave 3.1 g (58% yield) of (VI) as a brown solid after sublimation. Proton NMR was consistent with the product. FD-MS (m/z): 412.

Synthesis Example 2 (Compound IX)

5,12-di(p-tolyl)-5,12-dihydro-2,3-dimethyl-benzo(b)phenazine

In an Ace pressure bottle equipped with stirbar under an atmosphere of argon, were combined 5 g (19.2 mmol) of 5,12-dihydro-2,3-dimethyl-benzo(b)phenazine, 0.36 g of tris(dibenzylideneacetone)-dipalladium(0), dry degassed toluene (40 mL), 4-bromotoluene (5.2 mL, 42 mmol), tri(t-butyl)phoshine (0.96 mL of a 0.33 M solution in hexane), and finally 5.54 g of sodium t-butoxide (57.6 mmol). The bottle was sealed and heated at 125° C. (external temperature) for 12 h. The resultant reaction mixture was cooled, diluted with dichloromethane, and passed through a pad of silica gel. The eluent was concentrated and the process repeated to provide 7.95 g (94% yield) of (IX). Proton NMR was consistent with the product. ES-MS(m/z): 440

Synthesis Example 3 (Compound X)

5,12-di(2-naphthalenyl)-5,12-dihydro-2,3-dimethyl-benzo(b)phenazine

The above general procedure was followed using compound (III) [3.0 g, 11.5 mmol], 2-bromonaphthalene [4.95 g, 23.0 mmol], sodium tert-butoxide [3.4 g, 35.4 mmol), $Pd_2(dba)_3$ [300 mg, 0.32 mmol], few drops tri-tert-butylphosphine and 50 ml toluene. Workup procedure 1 was used which gave 4.0 g (68% yield) of (X) as a yellow solid after sublimation. Proton NMR was consistent with the product. FD-MS (m/z): 512.

Synthesis Example 4 (Compound XI)

5,12-di(6-methoxy-2-naphthalenyl)-5,12-dihydro-2,3-dimethyl-benzo(b)phenazine

The above general procedure was followed using compound (III) [3.0 g, 11.5 mmol], 2-bromo-6-methoxynaphthalene [5.5 g, 23.2 mmol], sodium tert-butoxide [3.4 g, 35.4 mmol], $Pd_2(dba)_3$ [300 mg, 0.32 mmol], few drops tri-tert-butylphosphine and 75 ml toluene. Workup procedure 1 was used which gave 4.0 g (61% yield) of (XI) as a yellow solid after sublimation. Proton NMR was consistent with the product. FD-MS (m/z): 572.

Synthesis Example 5 (Compound XII)

5,12-di([1,1'-biphenyl]-4-yl)-5,12-dihydro-2,3-dimethyl-benzo(b)phenazine

The above general procedure was followed using compound (III) [3.0 g, 11.5 mmol], 4-bromo-1,1'-biphenyl [5.4 g, 23.1 mmol], sodium tert-butoxide [3.4 g, 35.4 mmol), $Pd_2(dba)_3$ [300 mg, 0.32 mmol], few drops tri-tert-butylphosphine and 75 ml toluene. Workup procedure 1 was used which gave 5.6 g (86% yield) of (XII) as a yellow solid after sublimation. Proton NMR was consistent with the product. FD-MS (m/z): 564.

Synthesis Example 6 (Compound XIII)

6,13-di(p-tolyl)-6,13-dihydro-dibenzo[b,i]phenazine

The above general procedure was followed using compound (IV) [3.0 g, 10.6 mmol], 1-bromo-4-methyl-benzene [4.0 g, 23.4 mmol], sodium tert-butoxide [3.2 g, 33.3 mmol), $Pd_2(dba)_3$ [300 mg, 0.32 mmol], few drops tri-tert-butylphosphine and 75 ml toluene. Workup procedure 1 was used which gave 3.2 g (65% yield) of (XIII) as a yellow solid after sublimation. Proton NMR was consistent with the product. FD-MS (m/z): 462.

Synthesis Example 7 (Compound XIV)

6,13-di(2-naphthalenyl)-6,13-dihydro-dibenzo[b,i]phenazine

The above general procedure was followed using compound (IV) [2.6 g, 9.2 mmol], 2-bromonaphthalene [4.0 g, 19.3 mmol], sodium tert-butoxide [3.0 g, 31.2 mmol), $Pd_2(dba)_3$ [300 mg, 0.32 mmol], few drops tri-tert-butylphosphine and 60 ml toluene. Workup procedure 1 was used which gave 4.8 g (97% yield) of (XIV) as a yellow solid after sublimation. Proton NMR was consistent with the product. FD-MS (m/z): 534.

Synthesis Example 8 (Compound XV)

6,13-di(6-methoxy-2-naphthalenyl)-6,13-dihydro-dibenzo[b,i]phenazine

The above general procedure was followed using compound (IV) [3.0 g, 10.6 mmol], 2-bromo-6-methoxynaphthalene [5.55 g, 23.4 mmol], sodium tert-butoxide [3.2 g, 33.3 mmol), $Pd_2(dba)_3$ [300 mg, 0.32 mmol], few drops tri-tert-butylphosphine and 60 ml toluene. Workup procedure 1 was used which gave 4.0 g (63% yield) of (XV) as a yellow solid after sublimation. Proton NMR was consistent with the product. FD-MS (m/z): 594.

DEVICE EXAMPLES

The invention and its advantages are further illustrated by the specific examples which follow.

Device Examples 1-1 and 1-2 (Inventive)

EL devices satisfying the requirements of the invention were constructed in the following manner:

A ~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface by decomposing $CHF_3$ gas in an RF plasma treatment chamber. The substrate was then transferred into a vacuum deposition chamber for deposition of all other layers on top of the substrate. The following layers were deposited in the following sequence by sublimation from a heated boat under a vacuum of approximately $10^{-6}$ Torr:

a) a layer of Compound VI (see Table 2 for layer thickness);

b) a hole-transporting layer of N,N'-di(1-naphthyl)-N,N'-diphenyl-4,4'-diaminobiphenyl (NPB, see Table 2 for layer thickness);

c) a 37.5 nm light-emitting layer of tris(8-quinolinolato) aluminum (III) ($AlQ_3$);

d) a 37.5 nm electron transport layer of $AlQ_3$; and e) a 210 nm cathode formed of a 10:0.5 atomic ratio of Mg and Ag.

After the deposition of these layers, the device was transferred from the deposition chamber into a dry box for encapsulation.

Device Examples 2-1 and 2-2 (Inventive)

Devices were prepared as the same as device examples 1-1 and 1-2 except that compound VI was replaced with compound IX.

Device Examples 3-1 and 3-2 (Inventive)

Devices were prepared as the same as device examples 1-1 and 1-2 except that compound VI was replaced with compound X.

Device Examples 4-1 and 4-2 (Inventive)

Devices were prepared as the same as device examples 1-1 and 1-2 except that compound VI was replaced with compound XI.

Device Examples 5-1 and 5-2 (Inventive)

Devices were prepared as the same as device examples 1-1 and 1-2 except that compound VI was replaced with compound XII.

Device Examples 6-1 and 6-2 (Inventive)

Devices were prepared as the same as device examples 1-1 and 1-2 except that compound VI was replaced with compound XIII.

Device Examples 7-1 and 7-2 (Inventive)

Devices were prepared as the same as device examples 1-1 and 1-2 except that compound VI was replaced with compound XIV.

Device Examples 8-1 and 8-2 (Inventive)

Devices were prepared as the same as device examples 1-1 and 1-2 except that compound VI was replaced with compound XV.

Device Example 9-1 (Comparative)

A device was prepared as the same as device examples 1-1 and 1-2 except that layer (a) was omitted and the device contained an overall hole-transporting layer thickness substantially the same as the other examples.

The cells thus formed were tested for luminance with a constant current of 20 mA/$cm^2$ and the results are reported in Table 2. It can be seen from Table 2 that the compounds useful in the invention, when incorporated into EL cells, give an increase in luminance of 44–99% compared to the comparative device examples.

TABLE 2

Evaluation Results for Device Examples 1–9

| Device Example | Type | Layer (a) Thickness (nm) | Layer (b) Thickness (nm) | Cell Luminance (candela/$m^2$) | Relative Luminance (%) |
| --- | --- | --- | --- | --- | --- |
| 9-1 | Comparative | 0.0 | 75.0 | 525 | 100 |
| 8-1 | Inventive | 55.1 | 20.0 | 821 | 156 |
| 8-2 | Inventive | 75.1 | 0.0 | 265 | 50 |
| 7-1 | Inventive | 55.2 | 20.3 | 1023 | 195 |
| 7-2 | Inventive | 70.1 | 5.3 | 976 | 186 |
| 6-1 | Inventive | 55.0 | 20.1 | 906 | 173 |
| 6-2 | Inventive | 75.0 | 0.0 | 329 | 63 |
| 5-1 | Inventive | 5.3 | 70.3 | 1043 | 199 |
| 5-2 | Inventive | 20.1 | 55.0 | 834 | 159 |
| 4-1 | Inventive | 55.1 | 20.0 | 871 | 166 |
| 4-2 | Inventive | 70.2 | 5.2 | 834 | 159 |
| 3-1 | Inventive | 20.1 | 55.3 | 946 | 180 |
| 3-2 | Inventive | 55.0 | 20.1 | 986 | 188 |
| 2-1 | Inventive | 5.0 | 70.1 | 1027 | 196 |
| 2-2 | Inventive | 55.0 | 20.0 | 1013 | 193 |
| 1-1 | Inventive | 5.0 | 70.0 | 757 | 144 |
| 1-2 | Inventive | 55.1 | 20.1 | 893 | 170 |

It is noted that Device Examples 8-2 and 6-2 provide useful luminance although not as good as the previously known NPB compound. Moreover, when dihydrophenazine compounds are used in combination with the NPB compound, superior results are obtained compared to the use of NPB or the dihydrophenazine compound alone.

Device Examples 10-1, 10-2 and 10-3 (Inventive)

A series of EL devices were prepared as described in device examples 1-1 and 1-2. Compound VI was replaced with compound X and a green fluorescent dopant, 5,12-dihydro-5,12-diphenyl-quino[2,3-b]acridine-7,14-dione (DPQA), was co-deposited in the $AlQ_3$ light emitting layer (c) at a level of 0.6%.

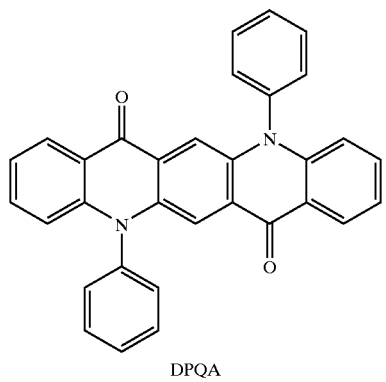

DPQA

Device Example 11-1 (Comparative)

A device was prepared as the same as device examples 10-1, 10-2 and 10-3 except that layer (a) was omitted and the device contained an overall hole-transporting layer thickness substantially the same as the other examples.

The cells thus formed were tested for luminance with a constant current of 20 mA/cm$^2$ and the results are reported in Table 3. It can be seen from Table 3 that the compounds useful in the invention, when incorporated into green doped EL cells, give an increase in luminance of 20–36% compared to the comparative device example. In addition, the EL color of the cells was green with average 1931 CIE color coordinates of x=0.315 and y=0.650. The EL spectra indicate that the green EL emission originates from the dopant in the Alq$_3$ layer. Cells containing the dihydrophenazine compound gave improved luminance.

TABLE 3

Evaluation Results for Device Examples 10–11

| Device Example | Type | Layer (a) Thickness (nm) | Layer (b) Thickness (nm) | Cell Luminance (candela/m$^2$) | Relative Luminance (%) |
|---|---|---|---|---|---|
| 11-1 | Comparative | 0.0 | 75.0 | 1756 | 100 |
| 10-1 | Inventive | 5.3 | 70.0 | 2300 | 131 |
| 10-2 | Inventive | 55.1 | 20.2 | 2392 | 136 |
| 10-3 | Inventive | 70.0 | 50.0 | 2103 | 120 |

The invention has been described in detail with particular reference to certain preferred embodiments thereof, but it will be understood that variations and modifications can be effected within the spirit and scope of the invention.

Parts List 101 substrate
103 anode
105 hole-injecting layer (HIL)
107 hole-transporting layer (HTL)
107a hole-transporting sublayer closer to anode
107b hole-transporting sublayer further from anode.
109 light-emitting layer (LEL)
111 electron-transporting layer (ETL)
113 cathode

What is claimed is:

1. A multilayer electroluminescent device comprising a cathode, an anode, a light emitting layer (LEL) and a layer disposed between the cathode and anode containing a dihydrophenazine compound represented by:

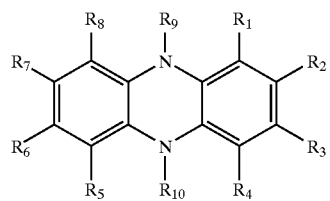

wherein:
$R_1$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino, or connected to $R_2$ to form 5 or 6 member rings which may be substituted or unsubstituted;

$R_4$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino, or connected to $R_3$ to form 5 or 6 member rings which may be substituted or unsubstituted;

$R_5$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl, substituted alkenyl, alkoxy, aryloxy, amino, or connected to $R_6$ to form 5 or 6 member rings which may be substituted or unsubstituted;

$R_8$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino, or connected to $R_7$ to form 5 or 6 member rings which may be substituted or unsubstituted;

$R_2$ and $R_3$ are individually hydrogen, alkyl of from 1 to 24 carbon atoms, which are branched, unbranched, or cyclic, halogen, aryl or substituted aryl of from 5 to 24 carbon atoms, heterocyclic or substituted heterocyclic, alkenyl or substituted alkenyl, alkoxy, aryloxy, amino, thioaryl, thioalkyl, or connected to form 5 or 6 member rings which may be substituted or unsubstituted;

$R_6$ and $R_7$ are individually hydrogen, alkyl of from 1 to 24 carbon atoms, which are branched, unbranched, or cyclic, halogen, aryl or substituted aryl of from 5 to 24 carbon atoms, heterocyclic or substituted heterocyclic, alkenyl or substituted alkenyl, alkoxy, aryloxy, amino, thioaryl, thioalkyl, or connected to form 5 or 6 member rings which may be substituted or unsubstituted; and $R_9$ and $R_{10}$ are individually alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl;

wherein one of $R_1$, $R_2$, $R_3$, $R_4$, $R_5$, $R_6$, $R_7$, and $R_8$, is other than hydrogen.

2. The multilayer electroluminescent device of claim 1 wherein the dihydrophenazine compound is of the formula:

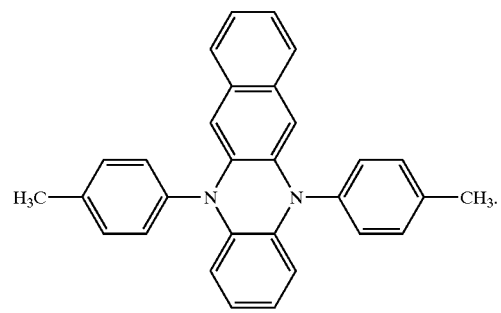

3. The multilayer electroluminescent device of claim 1 wherein the dihydrophenazine compound is of the formula:

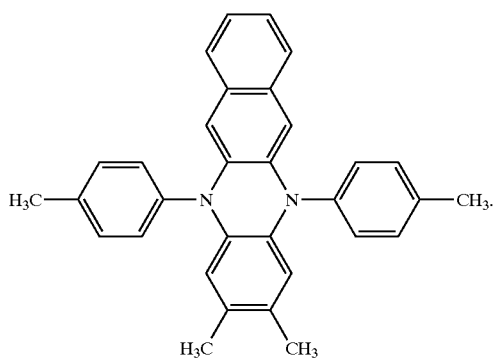

4. The multilayer electroluminescent device of claim 1 wherein the dihydrophenazine compound is of the formula:

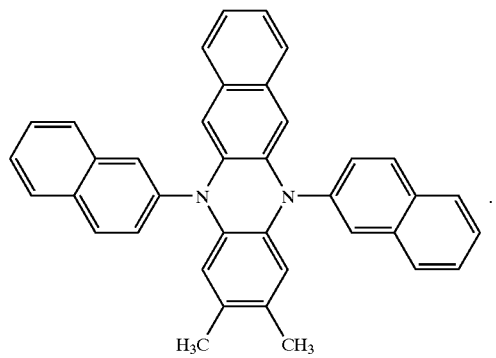

5. The multilayer electroluminescent device of claim 1 wherein the dihydrophenazine compound is of the formula:

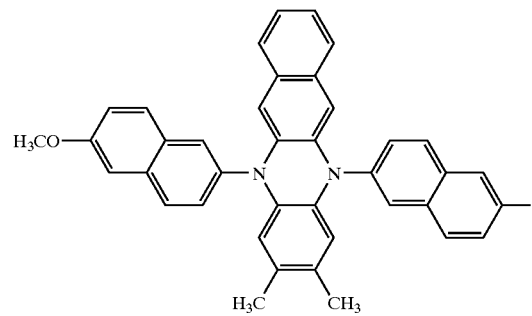

6. The multilayer electroluminescent device of claim 1 wherein the dihydrophenazine compound is of the formula:

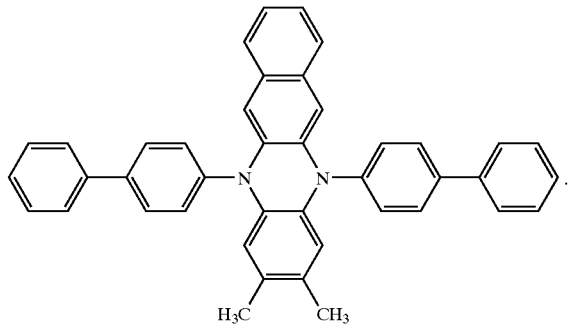

7. The multilayer electroluminescent device of claim 1 wherein the dihydrophenazine compound is of the formula:

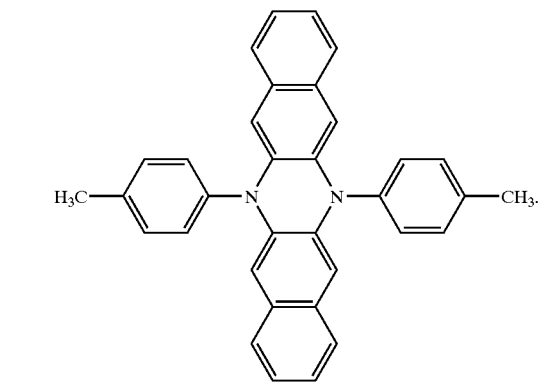

8. The multilayer electroluminescent device of claim 1 wherein the dihydrophenazine compound is of the formula:

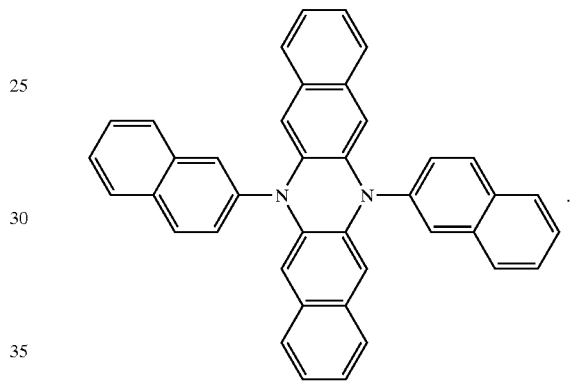

9. The multilayer electroluminescent device of claim 1 wherein the dihydrophenazine compound is of the formula:

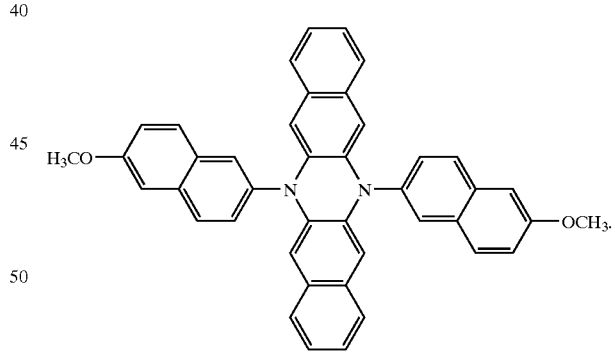

10. The multilayer electroluminescent device of claim 1 wherein the dihydrophenazine compound is contained in a layer that is adjacent to the anode.

11. The multilayer electroluminescent device of claim 1 wherein the dihydrophenazine compound is contained in a layer that is not adjacent to the anode.

12. The multilayer electroluminescent device of claim 1 wherein the dihydrophenazine compound is contained in a layer that is not adjacent to the light emitting layer.

13. The multilayer electroluminescent device of claim 1 wherein the dihydrophenazine derivative functions to improve hole-transporting and there is present in a layer between the anode and the light emitting layer a second compound that functions to improve hole transporting.

14. The multilayer electroluminescent device of claim 13 wherein the second compound is represented by:

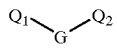

wherein $Q_1$ and $Q_2$ are independently selected aromatic tertiary amine moieties and G is a linking group or a bond.

15. The multilayer electroluminescent device of claim 13 wherein the second compound is contained in the layer adjacent to the light emitting layer.

16. The multilayer electroluminescent device of claim 13 wherein the second compound is N,N'-di(1-naphthyl)-N,N'-diphenyl-4,4'-diaminobiphenyl or N,N'-di-1-naphthalenyl-N,N'-di-2-naphthalenyl-[1,1'-Biphenyl]-4,4'-diamine.

17. A multilayer electroluminescent device comprising a cathode, an anode, a light emitting layer (LEL) and a layer disposed between the cathode and anode containing a dihydrophenazine compound represented by:

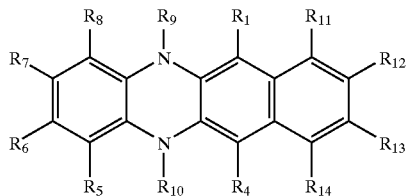

wherein:
- $R_1$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino or connected to $R_{11}$ to form 5 or 6 member ring systems;
- $R_4$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino or connected to $R_{14}$ to form 5 or 6 member ring systems;
- $R_5$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl, substituted alkenyl, alkoxy, aryloxy, amino, or connected to $R_6$ to form 5 or 6 member ring systems;
- $R_6$ and $R_7$ are individually hydrogen, alkyl of from 1 to 24 carbon atoms, which are branched, unbranched, or cyclic, halogen, aryl or substituted aryl of from 5 to 24 carbon atoms, heterocyclic or substituted heterocyclic, alkenyl or substituted alkenyl, alkoxy, aryloxy, amino, thioaryl, thioalkyl, or connected to form 5 or 6 member ring systems;
- $R_8$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino, or connected to $R_7$ to form 5 or 6 member ring systems;
- $R_9$ and $R_{10}$ are individually hydrogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl;
- $R_{11}$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl, substituted alkenyl, alkoxy, aryloxy, amino, connected to $R_1$ to form 5 or 6 member ring systems or connected to $R_{12}$ to form 5 or 6 member ring systems;
- $R_{12}$ and $R_{13}$ are individually hydrogen, alkyl of from 1 to 24 carbon atoms, which are branched, unbranched, or cyclic, halogen, aryl or substituted aryl of from 5 to 24 carbon atoms, heterocyclic or substituted heterocyclic, alkenyl or substituted alkenyl, alkoxy, aryloxy, amino, thioaryl, thioalkyl, or connected to form 5 or 6 member ring systems; and
- $R_{14}$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, amino, connected to $R_4$ to form 5 or 6 member ring systems or connected to $R_{13}$ to form 5 or 6 member ring systems.

18. The multilayer electroluminescent device of claim 17 wherein the dihydrophenazine compound is contained in a layer that is adjacent to the anode.

19. The multilayer electroluminescent device of claim 17 wherein the dihydrophenazine compound is contained in a layer that is not adjacent to the anode.

20. The multilayer electroluminescent device of claim 17 wherein the dihydrophenazine compound is contained in a layer that is not adjacent to the light emitting layer.

21. The multilayer electroluminescent device of claim 17 wherein the dihydrophenazine derivative functions to improve hole-transporting and there is present in a layer between the anode and the light emitting layer a second compound that functions to improve hole transporting.

22. The multilayer electroluminescent device of claim 21 wherein the second compound is represented by:

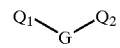

wherein $Q_1$ and $Q_2$ are independently selected aromatic tertiary amine moieties and G is a linking group or a bond.

23. The multilayer electroluminescent device of claim 21 wherein the second compound is contained in the layer adjacent to the light emitting layer.

24. The multilayer electroluminescent device of claim 21 wherein the second compound is N,N'-di(1-naphthyl)-N,N'-diphenyl-4,4'-diaminobiphenyl or N,N'-di-1-naphthalenyl-N,N'-di-2-naphthalenyl-[1,1'-Biphenyl]-4,4'-diamine.

25. A multilayer electroluminescent device comprising a cathode, an anode, a light emitting layer (LEL) and a layer disposed between the cathode and anode containing a dihydrophenazine compound represented by:

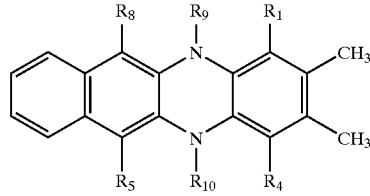

wherein:
- $R_1$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, or amino;

$R_4$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, or amino;

$R_5$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl, substituted alkenyl, alkoxy, aryloxy, or amino;

$R_8$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, or amino; and $R_9$ and $R_{10}$ are individually hydrogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl.

26. The multilayer electroluminescent device of claim 25 wherein the dihydrophenazine compound is contained in a layer that is adjacent to the anode.

27. The multilayer electroluminescent device of claim 25 wherein the dihydrophenazine compound is contained in a layer that is not adjacent to the anode.

28. The multilayer electroluminescent device of claim 25 wherein the dihydrophenazine compound is contained in a layer that is not adjacent to the light emitting layer.

29. The multilayer electroluminescent device of claim 25 wherein the dihydrophenazine derivative functions to improve hole-transporting and there is present in a layer between the anode and the light emitting layer a second compound that functions to improve hole transporting.

30. The multilayer electroluminescent device of claim 29 wherein the second compound is represented by:

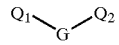

wherein $Q_1$ and $Q_2$ are independently selected aromatic tertiary amine moieties and G is a linking group or a bond.

31. The multilayer electroluminescent device of claim 29 wherein the second compound is contained in the layer adjacent to the light emitting layer.

32. The multilayer electroluminescent device of claim 29 wherein the second compound is N,N'-di(1-naphthyl)-N,N'-diphenyl-4,4'-diaminobiphenyl or N,N'-di-1-naphthalenyl-N,N'-di-2-naphthalenyl-[1,1'-Biphenyl]-4,4'-diamine.

33. A multilayer electroluminescent device comprising a cathode, an anode, a light emitting layer (LEL) and a layer disposed between the cathode and anode containing a dihydrophenazine compound represented by:

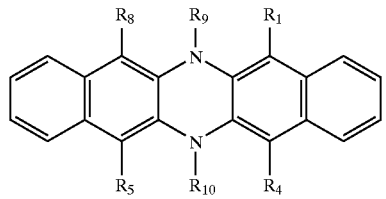

wherein:
$R_1$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, or amino;

$R_4$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, or amino;

$R_5$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl, substituted alkenyl, alkoxy, aryloxy, or amino;

$R_8$ is hydrogen, halogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl, alkoxy, aryloxy, or amino; and $R_9$ and $R_{10}$ are individually hydrogen, alkyl of from 1 to 24 carbon atoms, which are branched, unbranched, or cyclic, aryl or substituted aryl of from 5 to 24 carbon atoms, heterocyclic or substituted heterocyclic, alkenyl or substituted alkenyl.

34. The multilayer electroluminescent device of claim 33 wherein the dihydrophenazine compound is contained in a layer that is adjacent to the anode.

35. The multilayer electroluminescent device of claim 33 wherein the dihydrophenazine compound is contained in a layer that is not adjacent to the anode.

36. The multilayer electroluminescent device of claim 33 wherein the dihydrophenazine compound is contained in a layer that is not adjacent to the light emitting layer.

37. The multilayer electroluminescent device of claim 33 wherein the dihydrophenazine derivative functions to improve hole-transporting and there is present in a layer between the anode and the light emitting layer a second compound that functions to improve hole transporting.

38. The multilayer electroluminescent device of claim 37 wherein the second compound is represented by:

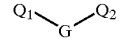

wherein $Q_1$ and $Q_2$ are independently selected aromatic tertiary amine moieties and G is a linking group or a bond.

39. The multilayer electroluminescent device of claim 37 wherein the second compound is contained in the layer adjacent to the light emitting layer.

40. The multilayer electroluminescent device of claim 37 wherein the second compound is N,N'-di(1-naphthyl)-N,N'-diphenyl-4,4'-diaminobiphenyl or N,N'-di-1-naphthalenyl-N,N'-di-2-naphthalenyl-[1,1'-Biphenyl]-4,4'-diamine.

* * * * *